United States Patent [19]

Young

[11] Patent Number: 4,607,430
[45] Date of Patent: Aug. 26, 1986

[54] METHOD AND APPARATUS FOR HIGH DENSITY WIRE HARNESS MANUFACTURE

[75] Inventor: Steven J. Young, Pittsburgh, Pa.

[73] Assignee: Westinghouse Electric Corp., Pittsburgh, Pa.

[21] Appl. No.: 670,526

[22] Filed: Nov. 13, 1984

[51] Int. Cl.⁴ .................... H01R 43/00; B65G 51/02; B25J 15/02
[52] U.S. Cl. .................................. 29/868; 29/33 F; 294/119.1; 414/751; 901/39
[58] Field of Search .................. 29/33 F, 564.6, 854, 29/564.4, 748, 56.5, 831; 81/9.51; 226/143–147, 158, 161, 162; 294/119.1; 414/751; 901/37, 39

[56] References Cited

U.S. PATENT DOCUMENTS

| | | | |
|---|---|---|---|
| 4,114,014 | 9/1978 | Shogo et al. | 29/564.6 X |
| 4,348,805 | 9/1982 | Gibbons | 140/93 R X |
| 4,454,652 | 6/1984 | Suzuki et al. | 29/564.4 X |

Primary Examiner—Mark Rosenbaum
Assistant Examiner—Carl J. Arbes
Attorney, Agent, or Firm—Thomas R. Trempus

[57] ABSTRACT

The invention is a system for the assembly of wire harnesses. More particularly the invention provides an assembly tool and a wire feed system for delivering a completed wire from a wire fabrication cell to the final wire harness assembly point. The assembly tool consists of two symmetrical parts which function together in jaw-like fashion to receive and then guide a wire to an assembly point. Each half of the assembly tool is double-ended, so that the wire may be inserted from either the left or right half of the assembly tool. The wire feed system includes a wire tensioning and centering tool mounted on the end effector and a pneumatically driven wire feed system. Back pressure is used to effectively blow the wire from a first point remote from the assembly point to the gripper for acquisition by the gripper. The wire harness assembly system also includes a stationary clamp which initially receives the terminated wire from the wire feed system and positions it for acquisition by the gripper and at least one and preferably several alignment fixtures disposed on various points of a wire harness formboard. The alignment fixtures are adapted to receive the contact end gripper thereinto for the proper alignment of the contact with the gripper prior to insertion of the contact into a connector. The invention also provides a technique whereby the manufacturer of high density wire harnesses can be effectively and efficiently carried out.

32 Claims, 15 Drawing Figures

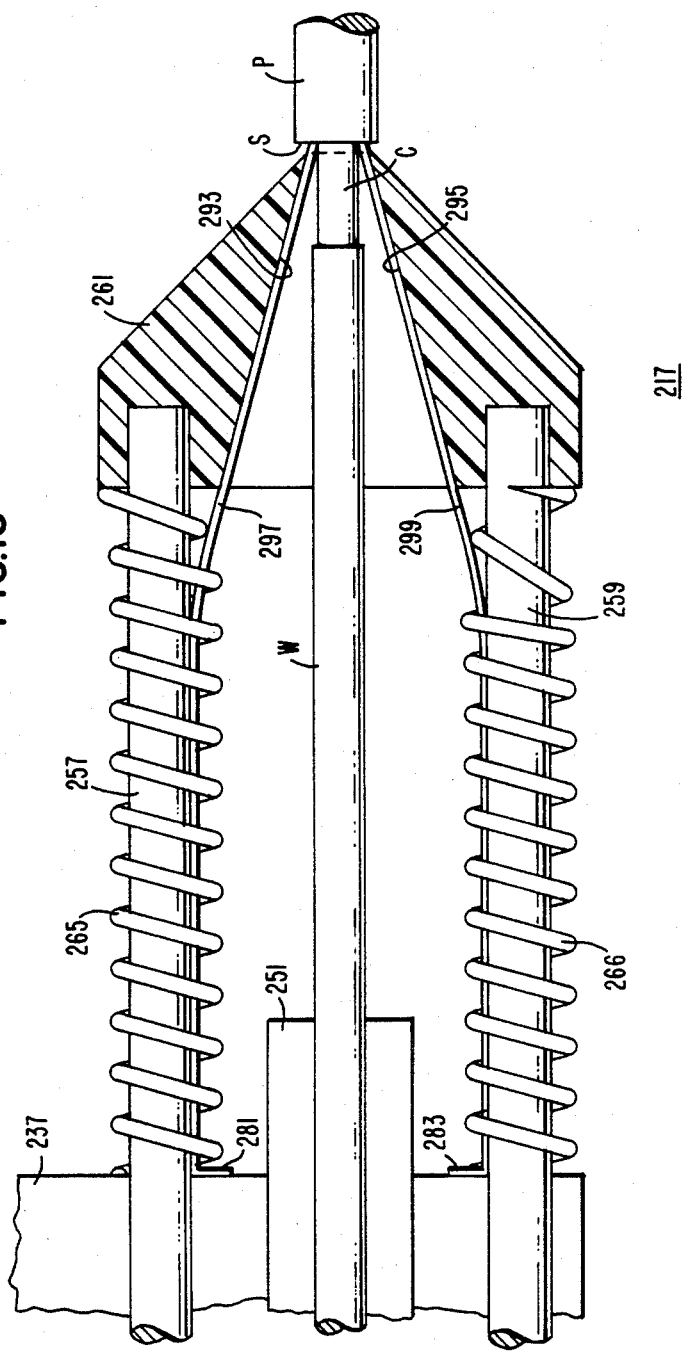

METHOD AND APPARATUS FOR HIGH DENSITY WIRE HARNESS MANUFACTURE

FIELD OF THE INVENTION

The invention relates to a method and apparatus for the automatic delivery, acquisition and insertion of terminated wires into standard connectors. More particularly, the invention provides a pneumatic system for transporting wires from preparation to assembly areas, an end effector which permits bidirectional insertion as well as wire control while routing, force sensing and control techniques for verification, error detection, and error recovery, and wire tension sensing for loading the robot hand.

BACKGROUND OF THE INVENTION

High density wire harnesses provide the primary interconnect system for modern computer-based electronic systems. Such complex harnesses are extremely difficult to fabricate, and manufacturers are increasingly interested in the potential for robotic systems to decrease cost and increase reliability of this assembly process. It is the present practice that harnesses are manually constructed using various wire insertion hand tools to aid the worker. These hand tools hold the small contact at the end of the wire to ensure that the contact seats and the contact shoulder engages the tines that lock the contact into the connector. The contact is pushed in until the worker feels the contact bottom out in the connector. After one end of the wire is in place, and the insertion is tested by pulling, the wire is then routed through various types of standoffs in a formboard. Finally, the remaining end of the wire is inserted into a second connector. This is an obviously time consuming and tedious process, prone to many errors since the harnesses are made in small batches and contain hundreds of wires. The present process of manual construction of high density wire harnesses leads to a large amount of rework.

It is, therefore, an object of the present invention to provide a method and apparatus for the automated construction of high density wire harnesses.

It is a further object of this invention to provide a pneumatic system for transporting wires from preparation to assembly areas.

It is yet another object of this invention to provide a robot hand which permits the bidirectional insertion as well as wire control while routing the wire along the formboard. As a result, no tool changing is required for different wires, pins or connectors.

It is still another object of this invention to provide force sensing and control techniques for verification, error detection, and error recovery.

It is a further object of this invention to provide a wire tension sensing technique for loading the second end of the bidirectional robot hand.

SUMMARY OF THE INVENTION

The invention is directed to a system for the acquisition and insertion of a terminated wire into an assembly point for the purpose of manufacturing high density multiple wire harnesses. This invention additionally provides a technique whereby a wire harness can be manufactured as well as a unique end effector for accomplishing this manufacturing task. The end effector is a bidirectional wire insertion tool which includes a first and second bracket means which include a strut portion and are adpated to be mounted onto an industrial manipulator and adapted for selected movement toward and away from each other. A first and second substantially symmetrical outer pair of jaws are slidably mounted in each of the strut portions for movement substantially perpendicular to the movement of the bracket means. The selected movement of the bracket means positions the outer jaw means in an open wire receiving position or a closed wire guidng an pin insertion position. The outer jaw means define a wire guiding channel when closed. Inner clamp means are disposed within the outer jaws and operatively associated with the strut members for selective actuation between a first open position and a second closed wire engaging position.

The end effector can additionally include a wire tensioning and centering tool which has a wire passage bore therethrough. This tool is operatively associated with one of the bracket means and is adapted for both elevational displacement and lateral displacement with respect to the wire passage channel defined by the outer jaw means. In a first extended position the wire passage bore of the tensioning and centering tool is aligned with the wire passage channel of the outer jaws. In a second retracted position the wire tensioning and centering tool is elevationally cleared above the outer jaws. Moreover the wire tensioning and centering tool is laterally movable between a first and second position to maintain on axis alignment with the outer jaws when the outer jaws are in their open wire receiving position.

A wire feed system for use in combination with the tensioning and centering tool of the end effector conveys the wire from a point remote from the end effector to a selected location for acquisition by the gripper. The wire feed system includes tube means operatively associated with the wire passage bore of the wire tensioning and centering tool. Means for generating a back air pressure in the tube causes the wire to be blown from the remote point to the selected location.

A stationary clamp means comprises a generally rectangular means which is mounted onto a formboard. The stationary clamp has a pneumatic piston mounted therein which is substantially perpendicular to a contact receiving bore dimensioned to receive therein a contact pin crimped onto the end of the wire to be routed on the formboard. When the contact is received into the bore, a clamp means is selectively actuated to positively retain the contact within the bore.

The system also includes one and preferably several alignment fixtures, each fixture being located proximate a connector into which a contact pin is to be inserted. The alignment fixture is adapted to receive a gripper engaged contact pin therein to insure that the connector pin is properly seated in the gripper jaws prior to insertion of the pin into the connector.

According to the technique of this invention, a wire comes from a wire preparation cell with both ends cut and terminated with contacts crimped in place. The wire feed system transports completed wires through a pneumatic tube driven by air pressure. At the wire assembly cell, the wire enters the stationary clamp on the formboard which aligns it, secures the pin, and positions the wire for pickup by the insertion gripper. Simultaneously a tensioning and centering device insures the proper tautness and positioning of the wire prior to pickup. The gripper moves on axis, feeding the wire from the tube, through its center and closes on the shoulder of the pin. The stationary clamp then deactivates and the gripper grasps the wire. Proper position of the pin for insertion is verified using the alignment fixtures adjacent to the connectors. The insertion gripper opens slightly while the alignment fixture accurately repositions the pin in the gripper for insertion.

First, the robot gripper aligns itself with the proper hole in the connector. The robot inserts the protruding pin into the connector until strain gauges sense the force increasing. When the position is correct, the gripper opens slightly and an inner clamp means in the gripper grasps the wire. As the insertion continues, the spring means in the gripper compress pushing the wire into the connector until force sensing indicates that the pin has bottomed into the connector. The tension of the wire is monitored as the tool is retracted to verify correct insertion. If for example sufficient tension is not present because the pin did not lock into place, the robot will try the insertion again.

Once the insertion is verified the tool routes the wire through the formboard layout as the wire is fed into the tool's other end. Wire tension is monitored during routing to detecting snagging or tangling. When the proper laying of the wire is complete, its second end is automatically loaded as the wire is pulled through the tool.

Loading of the second end is detected for force sensing. When the end of the wire is reached the tension in the wire increases because the contact crimped on the second end of the wire is engaged by the second end of the gripper. As a result the strain gauges indicate that the contact is loaded. The gripper runs the protruding pin of the second end into the alignment fixture for repositioning if required. The wire is now ready for insertion into the second connector. The movements required for insertion into the second connector are substantially similar to the movements described above. A programmable robot system adjusts its force sensing strategy according to the size of the pin and the type of connector into which the pin is to be inserted.

BRIEF DESCRIPTION OF THE DRAWINGS

The above as well as other features and advantages of the present invention can be readily appreciated through consideration of the detailed description of the invention in conjunction with the several drawings, in which:

FIG. 15 is a schematical representation of an alternate embodiment of the wire harness assembly tool of the invention.

DETAILED DESCRIPTION OF THE INVENTION

Figure 14:
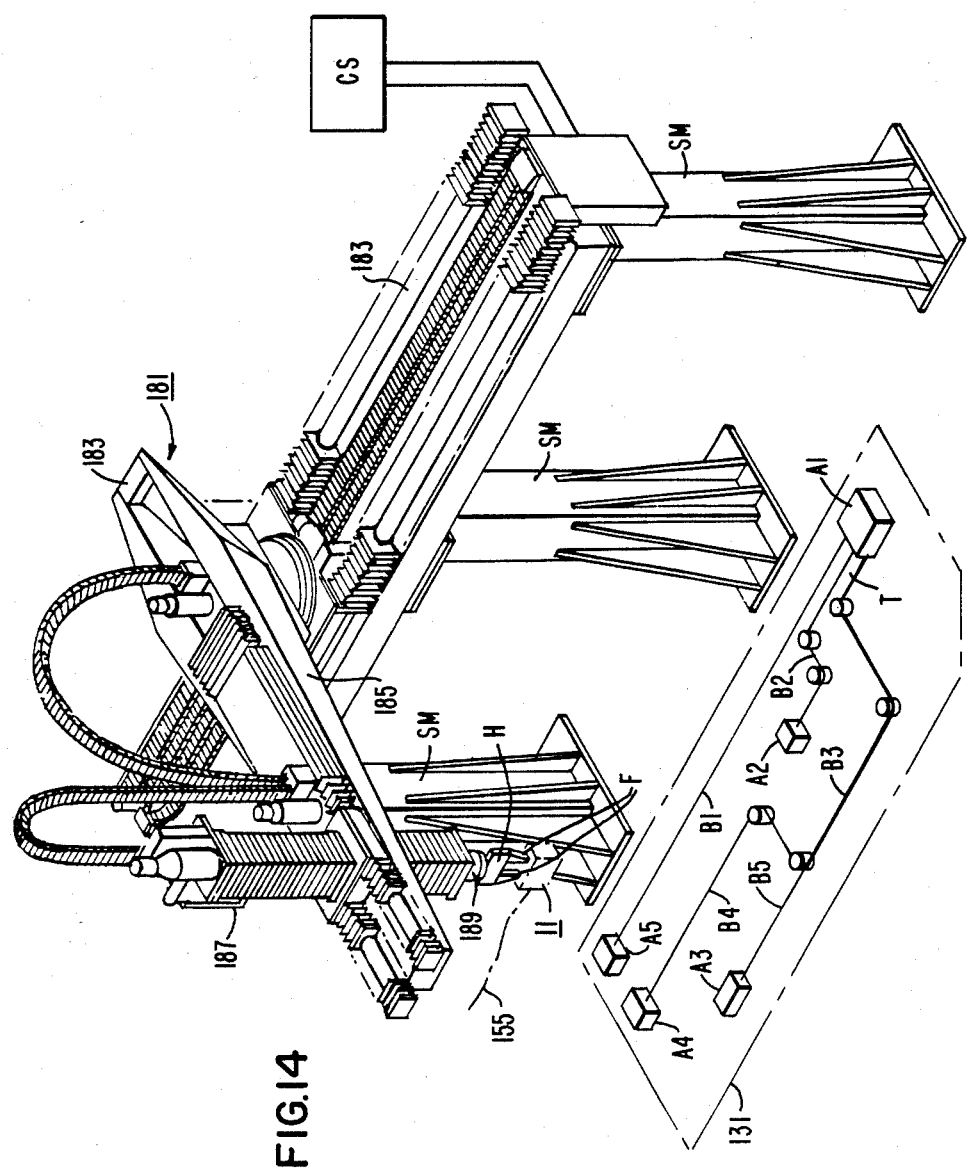
FIG. 14 is a schematical representation of a robotic manufacturing cell utilizing a UNIMATE Series 6000 electric robot with universal quick changing tooling adapter for use in combination with the end effector illustrated in FIG. 1 above.

The invention is directed to both a method and apparatus for the assembly of complex wire harnesses with multiple plug connectors. Several unique structural components function in harmony to provide a manufacturing cell capable of wire harness assembly. The end effector by which the process of this invention is carried out can be used in conjunction with a variety of robotic manipulators. It has been found preferable to use an orthogonal axes manipulator system, such as the UNIMATE Series 6000 electric robot for wire harness manufacturing. A similar manipulator system has been employed during the testing of the subject end effector by the inventor at the Robotics Institute at Carnegie-Mellon University at Pittsburgh, Pa., through the support of Westinghouse Electric Corporation, the assignee of this invention. The end effector of this invention is illustrated in an exploded isometric view in FIG. 1 with a detail of a portion thereof shown in FIG. 2. The end effector, generally indicated by the reference character 11 comprises a pair of mounting brackets 13 and 15, an assembly tool 17 and a wire tensioning and centering tool 19. The mounting brackets 13 and 15 of the end effector 11 include mounting holes 21 therein which permit the end effector 11 to be removably attached to a robotic hand, a bayonet-like mount for use in conjunction with a robot hand or any type of mounting configuration indigenous to the particular host robot to which the gripper or end effector is being attached. As schematically represented in FIG. 14 a robot hand indicated at H has a pair of fingers indicated at F. These fingers can be adapted to receive the mounting brackets 13 and 15 therein. Once such a mounting is used, the selective movement of the fingers F toward and away from each other causes the outer gripper jaws mounted on the brackets 13 and 15 to move toward and away from one another. The mounting bracket 13 is a generally L-shaped member from which a cantilevered arm 23 extends. The cantilevered arm 23, which provides a mounting point for the movable wire tensioning and centering tool 19, can be either an integral member of the bracket 13 or a separate member securely attached thereto.

Each of the mounting brackets 13 and 15 support the assembly tool 17. The assembly tool 17 consists of two symmetrical parts 25 and 27. The two symmetrical parts or two halves 25 and 27 of the assembly tool 17 function together in a jaw-like fashion to receive, engage and then route a wire to a connector or an assembly point. Each half 25 or 27 of the assembly tool is double ended as at 29 and 31 of the symmetrical half 25, and double ended as at 33 and 35 of the symmetrical half 27. As will be described in detail below, the assembly tool is double ended so that wire may be inserted into a connector by either the left or right half of the assembly tool. For the sake of clarity during description, the assembly tool 17 will be described as having a left half indicated at L, a right half indicated at R, a front portion indicated at F and a rear portion indicated at R. The wire transport tool can be seen to be located at what is designated the rear portion of the end effector. However, as will be described in detail below, in actual practice there is no front or rear to this double-ended assembly tool.

The "L" portion of the assembly tools includes a strut 37 which is defined by the downwardly depending L-shaped portion of mounting bracket 13. The strut 37 includes a pair of bores 39 and 41 extending therethrough. Additionally, a V-shaped seat 43 is provided on the inner surface of the strut 37. A bore 45 extends from the bottom of the V-shaped seat 43 outwardly through the strut member 37. A pneumatic cylinder 47 is mounted in the bore 45 and the piston 49 of the pneumatic cylinder 47 extends out through the V-shaped seat 43. An inner insertion clamp 51 is mounted on the piston 49 of the pneumatic cylinder 47. The inner insertion clamp 51 includes a V-shaped base portion 53 adapted to rest in the V-shaped seat 43 when in a first, or retracted position. A jaw-like portion 55 at one end inner clamp 51 is adapted to engage the opposed side of a second, symmetrical inner clamp 51' mounted on the right-hand bracket. The interaction of the left-handed inner clamp with the right-handed inner clamp will be described in detail below. The clamp is selectively activated to grip and release a wire held by the tool.

A pair of rods 57 and 59 are slideably mounted in bores 39 and 41 of strut 37 and extend outwardly therefrom in the directions indicated as front and rear of the gripper. A first collet 61 and 61' is mounted at the forward end of rods 57 and 59 and a second collet 63 and 63' is mounted at the back or rear end of rods 57 and 59. As can be seen from the view of FIG. 1, each collet comprises a first and second half, i.e. 61 and 61', and 63 and 63', which cooperate to support and guide the wire to its termination location. The collets are kept in a first or neutral position relative to the strut by a pair of springs 65 and 67 coiled about at least one of the rods on opposed sides of the strut 37 as illustrated herein. It is, of course, possible to provide biasing means on either the upper rod 57, the lower rod 59 or both the upper and lower rods. This construction allows the strut to slide closer to a selected collet and then back to a neutral position during pin insertion into a connector. Each of the collets 61, 61', 63 and 63' includes a channel 69 therein which cooperates with the channel of an opposed collet to form a bore through which the wire slides during the transport of the wire about the formboard by the end effector 11. Additionally, each of the collets can include a pair of knife edges as at 71 which cooperate with the knife edges of an opposed collet to more securely align the mated collets and guide the wires therethrough. To facilitate both the mating and alignment of the collet pairs 61 and 61' and 63 and 63', at least one and preferably two pin and bore alignment systems are provided. On each of the collets 61 and 63 there is provided a pair of bores 60 disposed above and below the channel 69. On each of the collets 61' and 63', there is provided a pair of pins 62 which are adapted to be received by the bore 61 opposite thereto. The combination of the pins and bores in each of the collets provides both stabilization to the gripper and alignment of each of the gripper halves with the other whenever the assembly tool 17 is in its closed position.

As can be seen by mounting the end effector 17 on the end of a conventional robot hand having the capability of spreading mounting brackets 13 and 15 apart from one another, the inner clamps 51 and 51' are capable of being engaged independently from the outer clamps collets 61, 61', 63 and 63 of the assembly tool.

Figure 1:
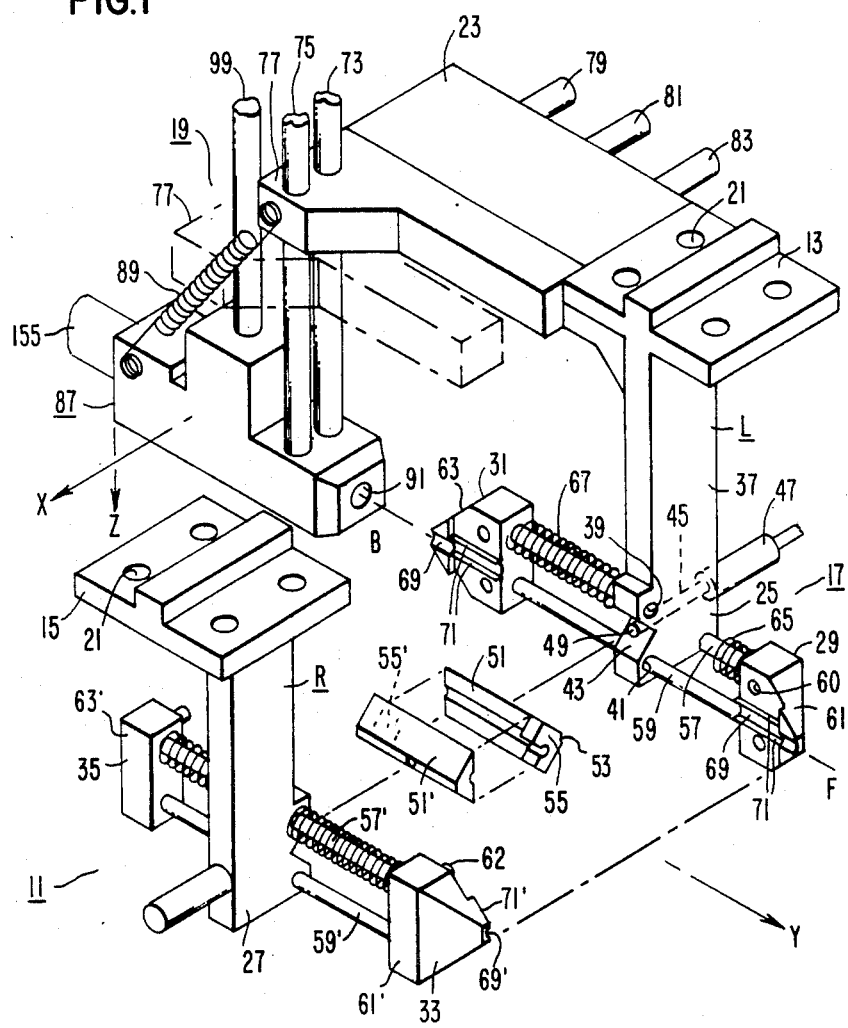
FIG. 1 is an exploded isometric view of the wire harness assembly tool end effector according to this invention.
Figure 2:
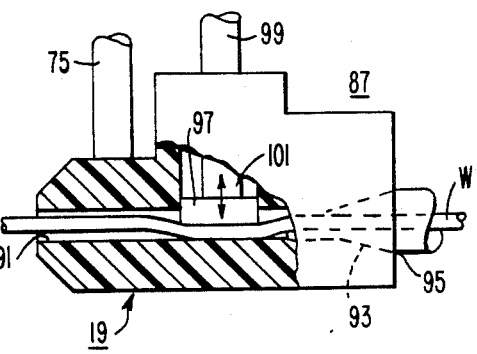
FIG. 2 is a detail of the wire tensioning and centering device in left elevation associated with the end effector.

Considering both FIGS. 1 and 2, the wire tensioning and centering tool 19 of the end effector 17 is mounted for independent movement along both an X axis and a Z axis, as shown in FIG. 1, in order to maintain a center position of its wire feed mechanism with respect to the independent movement along the X axis of the brackets 13 and 15 with their jaw assemblies therein. The tensioning and centering tool 19 is mounted for movement along a Z axis by at least one and preferably two pneumatic cylinders 73 and 75 which are mounted on bracket member 77. The bracket member 77 is in turn supported by at least one and preferably three pneumatic cylinders 79, 81, and 83 which are mounted on the rearwardly extending cantilevered arm 23 of mounting bracket 13. More particularly, bracket 77 is fixedly attached to the pistons of each of the cylinders 79, 81 and 83 for movement in an X axis direction as shown in dash-dot line. The main body portion of the wire tensioning and centering tool 19 is the tensioning and centering device 87 which is adapted for movement along the Z axis by means of the pistons in pneumatic cylinders 73 and 75 which are secured to and depend downwardly through bracket member 77. It will be seen that during normal operations of this end effector, the pneumatic cylinders 73 and 75 are actuated so that the tensioning and centering device 87 is at a first or maximum extended position in a downward, or Z axis direction relative to bracket member 77. When the pneumatic pressure is removed from cylinders 73 and 75, the tensioning and centering device 87 retracts to a second or elevated position with respect to the assembly tool 17. This elevation can be accomplished through internal springs mounted in the pneumatic cylinders 73 and 75 or it can be effected through the use of a biasing means, such as spring 89 extending between the bracket member 77 and the tensioning and centering device 87.

The tensioning and centering device 87 of the wire tensioning and centering tool 19 as shown in detail in FIG. 2, includes a bore 91 extending therethrough. The end of the bore distal from the assembly tool jaws can be preferably funnel-shaped as at 93. The pneumatic wire transport system is adapted to be connected to the tensioning and centering device 87 as at 95 in order to convey a wire having its connector pin clamped thereon to the wire transport tool. A clamp means 97 is disposed within the tensioning and centering device 87 and is adapted to engage a wire "W" inserted therethrough by the wire feed means. The clamp member 97 preferably consists of a pneumatic cylinder 99, the piston of which 101 is connected to the clamp means 97. Upon actuation of the pneumatic cylinder 99, the clamp member 97 is urged downwardly and engages the wire by securing it against the bottom wall of the bore 91. The actual functioning of the tensioning and centering device of the wire transport tool will be described in detail in association with the wire transport system as well as in connection with the description of the actual manufacture of a wiring harness hereinafter below.

Figure 3:
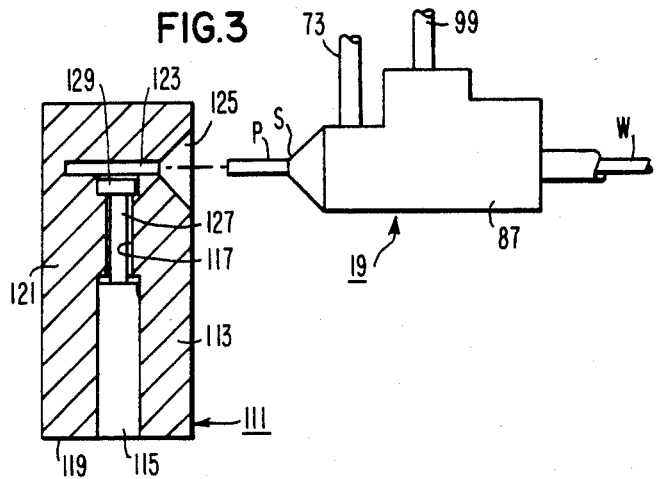
FIG. 3 is an elevational cross-sectional view of a stationary clamp apparatus mounted on the wire harness formboard which aligns and secures the pin and positions it for pick-up by the insertion gripper with the wire tensioning and centering device shown in left elevation.

An elevational, sectional view of a stationary clamp generally indicated by the reference character 111 is shown in FIG. 3 along with a rather limited schematical view of the tensioning and centering device 87 of the end effector 11 as shown in FIG. 1. The stationary clamp 111 comprises a generally rectangular member 113 which is mounted onto a formboard as will be described hereinafter. The stationary clamp 111 has a pneumatic piston 115 mounted in a bore 117 extending from the base 119 toward the upper region 121 of the block. Substantially perpendicular to the bore 117 is a contact receiving bore 123 dimensioned to receive therein a contact pin "P" crimped on the end of a wire to be routed on the formboard. The bore 123 is countersunk as at 125 to permit the crimped contact P to be received into the bore 123. The pneumatic cylinder 115 includes a piston 127 having a clamp means 129 disposed at the end thereof distal from the cylinder 115. When the contact P is received into the bore 123, the pneumatic cylinder 115 is actuated causing the clamp means 129 to positively retain contact P within the bore 123.

Figure 5:
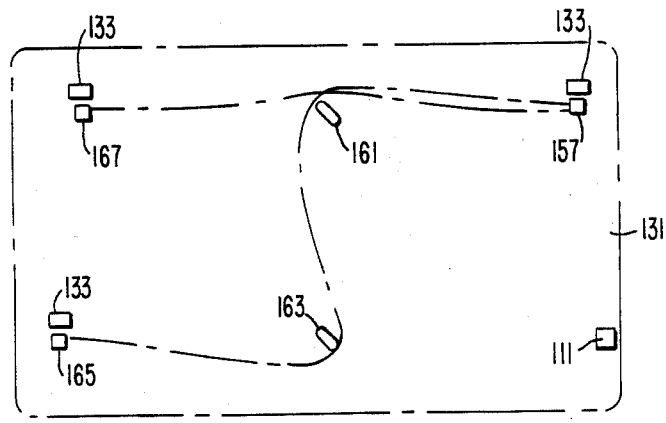
FIG. 5 is a schematical plan view of a wire harness formboard layout.

The stationary clamp 111 is mounted onto the formboard 131 shown in FIG. 5 in a schematical plan view. The stationary clamp 111 is fixedly positioned onto the formboard 131 at a location which is generally removed from the typical route to be followed during wire harness manufacture. The manner in which the stationary clamp 111 cooperates with the end effector 11 will be described in detail below.

Figure 4:
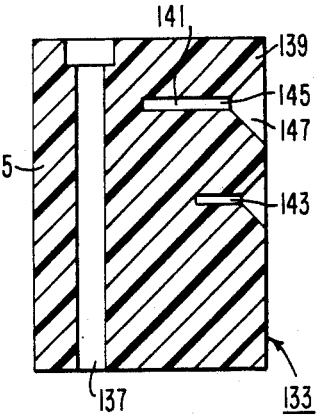
FIG. 4 is a cross-sectional elevational view of an alignment fixture for use in combination with the insertion gripper of this invention.

Turning to FIG. 4, an alignment fixture is generally indicated by the reference character 133 and briefly referring to FIG. 5, the alignment fixture can be seen located at multiple positions on the formboard 131. These positions are generally selected to be located adjacent the connectors to which the wires are assembled. The alignment fixture 133 comprises a block 135 having therein a mounting bore as at 137 which permits the alignment fixture 133 to be positively yet removably secured to the formboard 131 by a securing screw, clamp or the like, not shown herein. On at least one face 139 of the alignment fixture 133, at least one alignment bore is provided as at 141. The alignment bore 141 permits contact pin to be aligned with the collet of the assembly tool 17 as shown in FIG. 1 prior to the actual insertion by the assembly tool of the contact P into the connector. A plurality of alignment bores as at 141 and 143 can be provided in one face 139 of the alignment fixture 133. More particularly, the alignment bore 141 consists of an elongated passage 145 adapted to receive therein the contact P and a countersunk portion 147 into which the nose of the collet rests during alignment. The alignment bore 143 is dimensioned differently to accommodate a different size connector pin. It should be obvious that any number of alignment bores can be provided with a variety of internal configurations adapted to suit a variety of connector pins.

FIGS. 6 through 13 schematically illustrate the several steps utilized in the manufacture of a wire harness according to the method and apparatus of this invention. Moreover, these several features demonstrate the operation of the end effector 11 illustrated in FIG. 1. FIG. 14 shows a UNIMATE Series 6000 electric robot which can be used in combination with the wire delivery system and end effector described herein to manufacture wire harnesses. Reference will be made from time to time to the formboard shown in FIG. 5 in order to relate the actual steps schematically shown in the several figures to the actual manufacture of the wiring harness.

Figure 6:
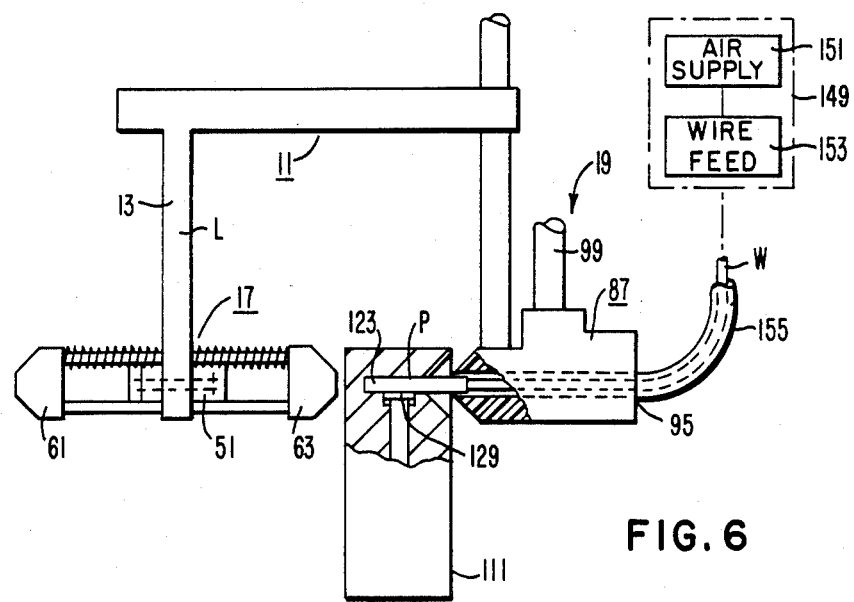
FIG. 6 is a schematical, elevational view of the wire entering a stationary clamp on the formboard with the end effector shown in left elevation wherein the stationary clamp aligns the wire, secures the pin, and positions the wire for pick-up by the insertion gripper.

Turning now to FIG. 6, in order to begin assembly, the gripper 11 must first acquire and load the wire W for insertion. The wire is prepared in a wire preparation cell at which a wire is cut to a predetermined length. Both ends of the wire are trimmed and each end of the wire is terminated with contacts which are crimped in place. Such a wire preparation cell is neither illustrated nor disclosed herein. Wire would then be transported either through an automated system or by a manually actuated technique to the pneumatic system for transporting wires to the end effector for harness assembly. The prepared wire pneumatic delivery system is generally indicated at reference character 149 of FIG. 6 and includes a wire feed means 153 and, an air supply 151 and a pneumatic delivery tube 155. The prepared wire is delivered to the feed means 153 and is then driven by air pressure through the tube 155 to the wire tensioning and centering device 87 quickly and smoothly. Each wire is loaded into an entry point fixture, i.e., the feed means 149 and sealed therein. The wire is then blown, with about 80 psi of back air pressure at an approximate rate of 25 feet per second, to the wire tensioning and centering device 87. A bank of Mac air valves has been interfaced through a parallel port for programmable control of the air pressure. The flexible tubing 155 preferably is made of inexpensive polyvinyl chloride tubing (PVC). The tube 155 terminates as at 95, in the tensioning and centering device 87 of the gripper 11. The contact P of the wire W enters the stationary clamp 111 on the formboard. After the wire contact P enters the contact bore 123, the clamp means 192 engages the contact by means of the actuation of the pneumatic cylinder 115 (see FIG. 3). In other words, after the wire enters the stationary clamp, an air cylinder is activated which secures the contact pin P of the wire and positions the wire for pick-up by the assembly tool 17. As can be appreciated through viewing both FIG. 1 and FIG. 6, at this point during the process, the jaws or right and left halves of the assembly tool 17 are in a spaced apart position so that both the right and left halves of the jaw can straddle the stationary clamp 111 as the gripper moves on axis, feeding the wire from the tube 155 through the tensioning and centering device 87 thus positioning and centering the wire W for pick-up by the assembly tool.

Figure 7:
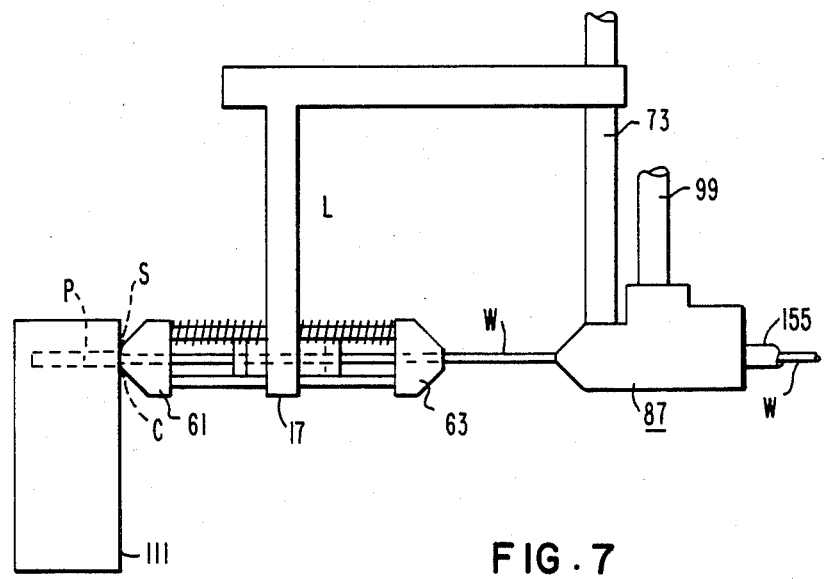
FIG. 7 is a schematical elevational view of the end effector shown in left elevation moving on axis to feed the wire from the tube and closing on the shoulder of the pin.

Turning to FIG. 7, it can be seen that the tensioning and centering device 87 has moved on axis away from the stationary clamp 111 so that both the tensioning and centering device 87 of the gripper 11 as well as the assembly tool 17 are on the same side of the stationary clamp 111. The internal clamp means 101 shown in FIG. 2 of the tensioning and centering device 87 is activated thus ensuring the proper tautness and positioning of the wire. At this point, the right and left halves of the assembly tool 17 are closed together in order to position the wire within the channel 69 defined by the collets 61, 61', 63 and 63' of both the right and left halves of the alignment tool. The head consisting of collets 61 and 61' of the gripper now closes on the shoulder S of the pin P, the stationary clamp means 129 deactivates and the gripper grasps the wire. The wire is now ready for verification of proper position for insertion. The collet pair 61 and 61' at the forward end of the gripper 11 has now engaged the crimped portion C of the contact pin P which is aft of the shoulder portion S and securely holds the crimped portion for transport of the wire to the various other stations on the formboard.

Figure 8:
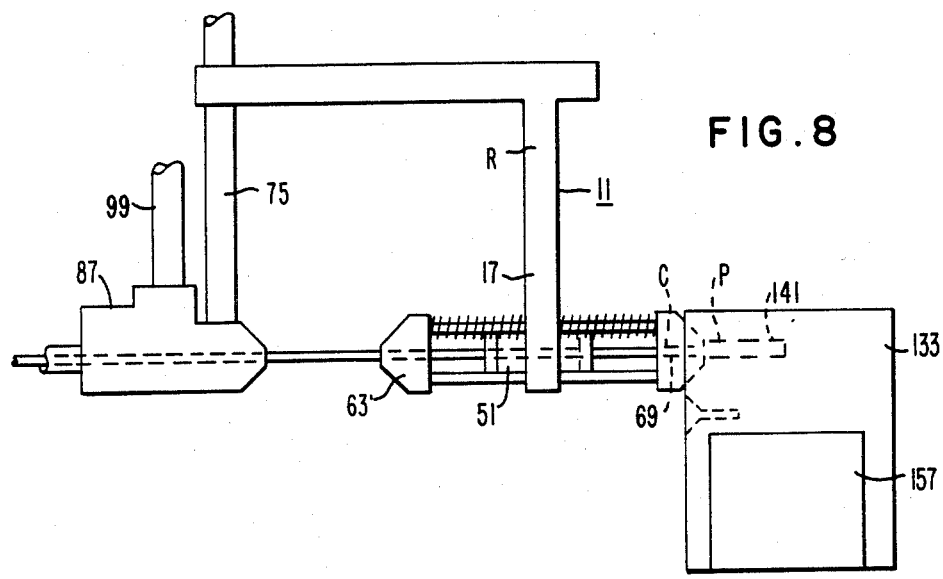
FIG. 8 is a schematical elevational view of the alignment fixture in position with the end effector shown in right elevation and wire connector.

As can be seen on the formboard of FIG. 5, the gripper 11 is manipulated by the overhead robot to remove the wire from the stationary clamp 111 (FIG. 8) and convey the wire to the first assembly point represented by connector 157. Throughout this operation, the wire itself is merely being repositioned along with the gripper. The wire is not being conveyed through the tube, rather the wire is in the tube but not being drawn therethrough. Proper position of the pin P for insertion is verified using the alignment fixture 133 adjacent the connector 157 on formboard 131. While in this illustration, the alignment fixture 133 is mounted alongside of the connector 157, it can be appreciated that an integral mount can be provided which holds both the connector and the alignment fixture. In actual practice, as shown in FIG. 8, the assembly tool 17 inserts the connector pin P into the bore 141 which is designed to accommodate the particular contact pin being inserted. The insertion gripper momentarily open while the alignment fixture accurately repositions the pin with respect to the gripper for insertion. Once alignment has been completed, the gripper jaws close, causing the assembly tool to once again securely position the crimped portion of the connector within the bore 69.

Figure 9:
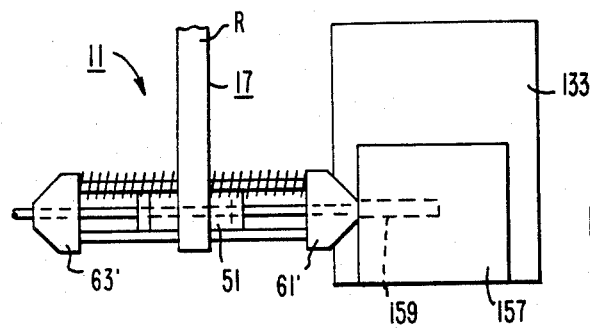
FIG. 9 is a schematical elevational view of the end effector shown in right elevation, aligned with the proper hole in the connector and inserting the protruding pin into the connector.
Figure 10:
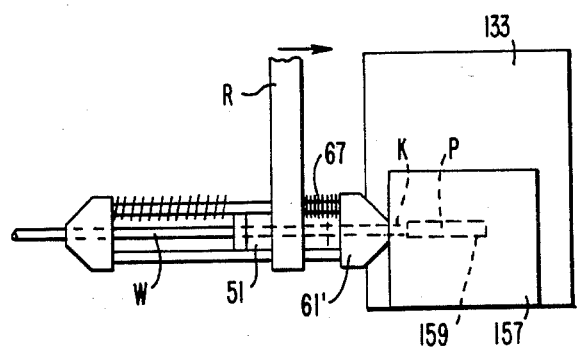
FIG. 10 is a schematical elevational view of the robot end effector in right elevation with the inner clamps of the assembly tool gripper grasping the wire and inserting the pin into the connector.
Figure 11:
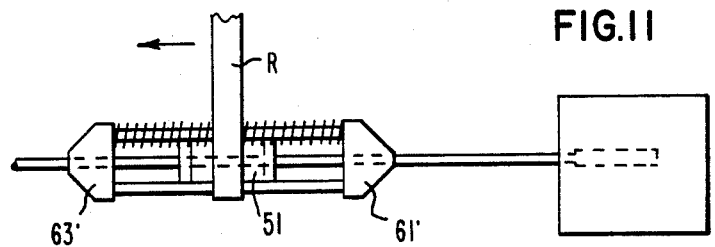
FIG. 11 is a schematical elevational view of the robot end effector in right elevation testing the wire pin seating in the connector.
Figure 12:
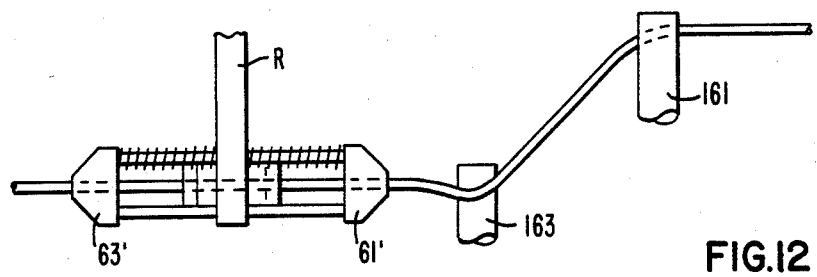
FIG. 12 is a schematical elevational view of the robot end effector in right elevation pulling the wire through the tool and routing the wire about the standoffs on the formboard.

Considering now FIGS. 9 and 10, first, the assembly tool via the gripper 11 aligns itself with the proper hole 159 in the connector 157. The robot inserts the protruding pin P into the connector bore 159, until the strain gauges on the robot wrist sense the force increasing. If the pin P has not penetrated the connector far enough, which would indicate an obstruction, the robot would retract and retry the insertion until the position is correct or the robot will stop and signal for help if incorrect. Once the connector pin P has been properly inserted into the bore 159 of the connector 157, the assembly tool opens slightly so that the collets 61, 61', 63 and 63' which define the outer clamp no longer engage the crimped portion C of the connector pin. At this point, the internal clamps 51 of the assembly tool 79 are actuated by the appropriate pneumatic cylinders in order to grasp the wire. The robot arm now moves the struts toward the assembly point, i.e., the connector 157. The lateral movement of the robot arm forces the springs 67 to compress. This compression action pushes the strut closer to the collet 61, 61' urging the wire forward and further forcing the pin to seat in the assembly point. Thus, the movement of the strut with the internal clamps 51 relative to the collet pushes the wire into the connector until force sensing indicates that the pin has bottomed into the connector. This step can be repeated if necessary. The tension of the wire is monitored as the tool is retracted to verify correct insertion. If sufficient tension is not present, for example, if the pin did not lock into place, the robot is programmed to try the insertion again. Insertion is verified as illustrated in FIG. 11, through the gripping of the wire by the inner clamp means 51 and slight movement of the robot in a direction opposite the direction of insertion in order to verify that appropriate tension is present.

Once the insertion is verified, the tool routes the wire through the formboard layout as the wire is fed into the tools' opposite end. As can be seen in FIG. 5, this routing would take place from connector 157 past standoff 161, standoff 163 and to alignment fixture 133 adjacent connector 165. For illustrative purposes, a third alignment fixture 133 is shown adjacent connector 167. It should be appreciated that the actual disposition of the wires in the wire harness is one of manufacturing requirement and dictated by the application of the wire harness itself. Accordingly, any number of a variety of standoffs and connectors can be used in conjunction with the present gripper apparatus and the process and technique described herein. During the routing of the wire, the several collets are adjacent one another, defining the bore 69 and the internal clamp 51 is disengaged from the wire. The wire passes through the bore 69 as it exits the tensioning and centering device 87. Wire tension is monitored during the routing to detect snagging or tangling. When the proper laying of the wire is complete, its second end connector pin P of the wire W is automatically loaded as the wire is pulled through the bore 69 and seats in the collet pins 63 and 63'.

Figure 13:
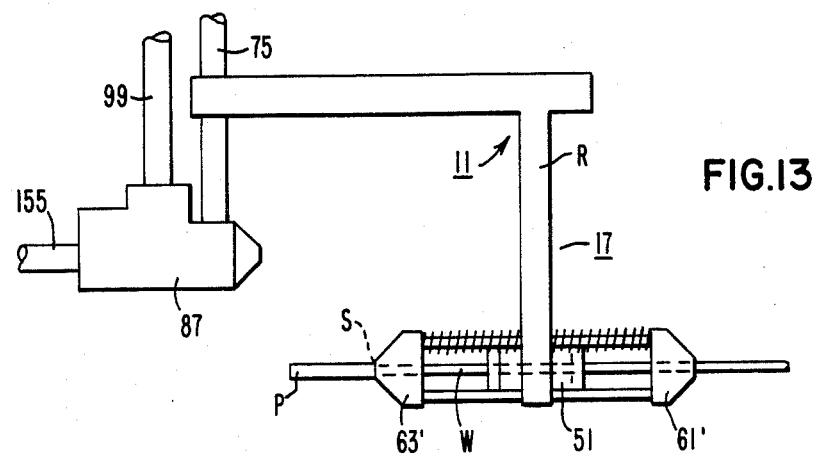
FIG. 13 is a schematical elevational view of the loading of the wire pin into the second end of the robot end effector which is shown in right elevation.

Turning to FIG. 13, the loading at the second end is also detected by force sensing. When the shoulder S of the contact pin P reaches the collet pair 63 and 63' of the assembly tool 17, the tension in the wire increases and the strain gauges of the robot hand indicate that the contact is loaded. Once this is so detected by the strain gauges, it is also clear that the second end of the wire is free of the tensioning and centering device 87. As a result, the pressure in the several cylinders 73 and 75 by which the tensioning and centering device 87 is maintained in a downwardly extended position is removed and the tensioning and centering device is spring biased into a second or upper position. With the tensioning and centering device in its second, upward position, the second end or back end of the assembly tool defined by the collet pin 63 and 63' now has access to both the alignment fixture 133 and the connector 165 adjacent thereto. As described above in detail, the robot gripper runs the protruding pin P of the second end of the wire into the alignment fixture for repositioning if necessary. The wire is now ready for insertion into the second connector. The movements required for the insertion into the second connector are similar to the movements required for the insertion into the first connector. It should be noted that any number of a variety of connectors can be utilized. If, however, the pin size is different and the force required for insertion are therefore different, the programmable robot system adjusts its force sensing strategy for this new situation. The pin is inserted and once again, there is a pull test after insertion to verify proper locking of the pin into the connector. Reference may be had to the description in association with FIGS. 8, 9 and 10 for details of the pin alignment and insertion procedures.

It should be appreciated that due to the complex nature of wire insertion in automated high density wire harness assembly, it is necessary to integrate sensors into the assembly tooling. Such an integration of sensors is known and is available in many commercial robots, therefore the operation of strain gauges will not be discussed in detail herein. Typically, strain gauges are utilized to provide the sensor input necessary for such assembly. As a result, force monitoring is used in insertion and wire routing. Forces are monitored by a computer through the use of strain gauges. The strain gauges output or force is represented in a program as a variable which is accessible at any time in order to determine the forces being applied to the gripper. Before insertion, the forces on the terminating end are monitored as the gripper approaches the connector to assure that the path is clear. Force feedback would indicate an obstruction, causing the robot to generate a new path and retry the insertion. During insertion, force feedback is used in conjuction with position feedback to determine when the pin has bottomed out into a connector. When a predetermined increase in force is indicated, the position is checked, to determine if the pin is seated properly in the connector. After insertion, the gripper retracts and strains the wire. The force is checked once again. No force indicates that the pin hasn't locked into the connector and the insertion would thus be retried with a new path. If proper force is sensed, the assembly is continued. In order to complete the assembly, that is, to insert the second end of the wire, the second terminated end must be located. The gripper moves on axis with the wire until the force increases, indicating that the second termination is in the gripper and is ready for final insertion. The aforedescribed sensor based assembly increases the reliability of the insertions by providing a method for error recovery and also provides a valuable tool for locating the end of the wire in preparation to the loading of the second end of the wire and to the second end of the wire insertion gripper. Such strain gauges can be incorporated into a compliant wrist or a robot hand which would grip and actuate the end effector described herein. Such wrists and hands are commercially available and the use of strain gauges to monitor the movement of the wrists and hands is well known to those skilled in the art of automated manufacturing.

Turning to FIG. 14, a UNIMATE Series 6000 robot is somewhat schematically illustrated and typifies the robot having the capability of travel in the X, Y and Z axes. Additionally, the hand H and wrist 'S' of this robot provide roll, pitch and yaw to the end effector disposed thereon. It should further be appreciated that the wire delivery system consisting of the pneumatically powered tube 155 can be positioned about the various elements of the main robot system in order to follow the end effector as it routes the wire about the formboard.

The UNIMATE Series 6000 robot is a manipulator system 181 comprising three orthogonal axis assemblies consisting of the X axes assembly 183, the Y axes assembly 185, and the Z axes assembly 187. A multiple axis rotary wrist mechanism 189 is mechanically secured to the Z axis assembly 187 in order to accommodate end effector 11 of this invention which is schematically represented thereon. The operative combination of the X, Y and Z axes assemblies is supported in a gantry type configuration by the vertical support members SM which are secured to the floor of the work facility. Machine tool type control of the operation of the manipulator system 181 is implemented by conventional numerical control consoles such as the PRODUCER TM CNC System which is available from the Westinghouse Electric Corporation. Disposed below the gantry arm 185 is a formboard shown at 131. A wire harness is shown extending between a plurality of assembly points A1 through A5 and consisting of the several branches B1 through B5 extending from trunk T. The formboard would be positioned to be fully within the working envelope of the UNIMATE Series 6000 robot. As described above, a hand H is disposed on the wrist 189. The hand H includes a pair of fingers F with one of the fingers being mechanically interconnected to the bracket 13 of the gripper 11 and the other of the fingers being interconnected to the bracket 15 of the end effector. Thus the manipulation of the fingers F causes the gripper jaws designated L and R of FIG. 1 to move toward and away from each other. The hand H and/or the wrist 189 can include therein the strain gauge system previously described. It is this strain gauge system which provides both the force sensing and feedback information utilized in the wire routing and insertion effected through the present end effector.

What has been described is a method and an apparatus for the automatic delivery, acquisition and insertion of terminated wires into standard connectors. The invention provides a pneumatic system for transporting wires from preparation to assembly areas, an end effector which permits bidirectional insertion as well as wire control while routing, force sensing and control techniques for verification, error detection, error recovery, and wire tension sensing for loading the robot hand.

It is to be understood that the specific embodiment described in association with FIG. 1 is a prototype double-ended end effector wire harness assembly tool which has been reduced to practice for the purpose of providing the viability of the techniques described herein. Accordingly, certain modifications can be incorporated into the gripper to enhance its operation. More particularly, the collets 61, 61', 63 and 63' can be designed to have a more elongated profile to facilitate the insertion of connector pins into high density connectors. In such an embodiment with elongated collets, the functioning of the gripper would be substantially similar to the functioning of the gripper shown in FIG. 1. Additionally with more refined machining techniques, the gripper shown in FIG. 1 can be modified so that each of the collets is supported by a single elongated member 57 as opposed to the pair of rods shown in FIG. 1. Turning to FIG. 15, an additional feature which can be incorporated into the assembly tool generally indicated by the reference character 217, includes finger members 297 and 299. For the purpose of simplifying the explanation, only one-half section of a single half of the gripper is shown. The strut member 237 includes bores which support upper and lower rods 257 and 259 as described above. An internal clamp means 251 can be provided in the strut members as described above in connection with FIG. 1. The finger means 297 and 299 extend from the strut member to the nose of the collet 261. The fingers 297 and 299 are held in place by the springs 265 and 266 of the tool and the channels at 293 and 295 in the collet 261. One end of each finger rests against the strut member 237 as at 281 and 283 while the other end of the finger rests against the shoulder S of the pin P, already mounted onto the end of the wire W. The fingers push against the shoulder and insert the wire into the final assembly point. During actual insertion operations, as soon as the pin mounted wire is in the proper location, the robot arm moves the strut toward the assembly point. The lateral movement of the robot arm forces the springs of the tool to compress. This compression action results as the strut becomes closer to the collet and urges the finger members forward and forces the pin to seat in the assembly point. Thus, the movement of the strut relative to the collet causes the fingers to project from the nose of the collet; and the fingers the insert the pin into the final assembly point. When assembly is complete, the springs recoil and the strut moves back to its neutral position, such that the fingers retract completely into the collet. In order to verify proper insertion of the pin the clamp means 251 is activated to grip the wire. Then, the robot arm gently tugs on the wire to make certain that the pin is securely inserted into the connector. If the tension in the wire is low, the pin has not been inserted correctly. Therefore, the assembly process must be repeated. If, however, the robot measures an adequate amount of tension in the wire, the clamp means 251 is disengaged, and the tool is now ready to repeat the insertion process with the free end of the wire, using the opposite end of the wire insertion tool. The robot then moves along a preprogrammed path until it encounters the next assembly point and the insertion process is repeated.

While in the embodiment described immediately above, the clamp means 251 was only described as being used in conjunction with the insertion testing procedure, it should be appreciated that the clamp means 251 can be engaged as described in connection with the embodiment of FIG. 1 to cooperate with the finger means 297 and 299 for the insertion of the connector pin P into a connector. Here again the collets would be modified to provide a more elongated profile to facilitate the insertion of connector pins into high density wire harnesses.

What has been described is a method and apparatus for the automatic delivery, acquisition and insertion of terminated wires into standard connectors. More particularly, the invention provides a pneumatic system for transporting wires from a preparation cell to assembly areas, an end effector which permits bidirectional insertion as well as wire control while routing, force sensing and control techniques for verification, error detection, error recovery, and wire tension sensing for loading the robot hand.

What is claimed is:

1. An end effector for the insertion of a terminated wire into a connector comprising:
   first and second bracket means adapted to be mounted onto an industrial manipulator, said bracket means including a strut portion, said bracket means being adapted for selected movement toward and away from each other;
   first and second substantially symmetrical outer jaw means, each of which jaw means is slidably mounted in said strut portion for movement substantially perpendicular to the movement of said bracket means; whereby the selected movement of the bracket positions said outer jaw means in an open wire receiving position or a closed wire guiding and pin insertion position, said outer jaw means defining therein a wire guiding channel when closed; and
   inner clamp means disposed within said outer jaw means for selective actuation between a first open position and a second closed, wire engaging position.

2. The end effector of claim 1 wherein the first and second outer jaw means which are slidably mounted with respect to the strut portion of the bracket means include biasing means operatively associated with the bracket means and the outer jaw means for maintaining the outer jaws in a neutral position with respect to the strut portion.

3. The end effector of claim 2 wherein each strut portion includes at least one bore therein, and the first and second substantially symmetrical outer jaws include at least one rod means slidably disposed in said at least one bore and a collet disposed at each end of said slidably mounted rod, each of said collets defining in part the wire guiding channel.

4. The end effector of claim 3 wherein the biasing means are spring means concentrically disposed about the rod means.

5. The end effector of claim 4 wherein the strut portion has two bores therein, and each of the two outer jaws includes two rod means slidably disposed in the two bores and wherein at least one of the rods has a spring biasing means mounted thereon.

6. The end effector of claim 5 wherein each of the collet means includes a pair of knife edge guide means disposed therein.

7. The end effector of claim 1 wherein the inner clamp means comprise pneumatically actuated cylinders disposed in each of the strut portions, with pistons extending outwardly therefrom toward the opposed strut member, and clamp means mounted on each of said pistons, whereby actuation of said pneumatic cylinders cause said pistons to urge the clamp means against each other.

8. The end effector of claim 7 wherein the clamp means includes channels therein which define a wire gripping passage when said clamp means is engaged.

9. The end effector of claim 8 wherein the inner clamp means channels are V-shaped grooves which can accommodate and securely grasp therebetween the wire to be inserted into a connector.

10. The end effector of claim 1 including a wire tensioning and centering tool having a wire passage bore therethrough operatively associated with one of the first and second bracket means and adapted for elevational displacement with respect to the wire passage channel of the outer jaw means, such that in a first extended position the wire passage bore of the tensioning and centering tool is aligned with the wire passage channel of the outer jaws and in a second retracted position, the wire tensioning and centering tool is elevationally cleared from the outer jaws, and wherein the wire tensioning and centering tool is laterally movable between a first and second position in order to maintain on axis alignment with the outer jaws when said jaws are in the open wire receiving position.

11. The end effector of claim 10 wherein the wire tensioning and centering device includes clamp means therein for the selected engaging of a wire disposed in the wire passage bore therethrough.

12. The end effector of claim 11 wherein the clamp means includes a pneumatically actuated cylinder.

13. The end effector of claim 11 wherein the wire tensioning and centering device is operatively associated with the bracket means by at least one pneumatic cylinder for effecting lateral movement and at least one pneumatic cylinder for effecting elevational displacement.

14. The end effector of claim 10 including a wire feed system for conveying a wire from a point remote to the end effector to a selected location for acquisition by the end effector, said wire feed system comprising tube means operatively associated with the wire passage bore of the wire tensioning and centering tool, and means operatively associated with said tube means for generating a back air pressure in said tube means to blow the wire from the remote point to the selected location for acquisition.

15. A system for the acquisition and insertion of a terminated wire into an assembly point mounted on a formboard comprising:

an end effector comprising first and second bracket means adapted to be mounted onto an industrial manipulator, said bracket means including a strut portion, said bracket means being adapted for selected movement toward and away from each other;

first and second substantially symmetrical outer jaw means, each of which is slidably mounted in said strut portion for movement substantially perpendicular to the movement of said bracket means; whereby the selected movement of the bracket means positions said outer jaw means in an open wire receiving position and a closed wire guide and pin insertion position, said outer jaw means defining therein a wire guiding channel when closed;

inner means disposed within said outer jaw means for selective actuation between a first open position and a second closed wire engaging position;

wire tensioning and centering means having a wire passage bore therethrough operationally associated with one of the first and second bracket means and adapted for elevational displacement with respect to the wire passage channel of the outer jaw means, such that in a first extended position the wire passage bore of the tensioning and centering tool is aligned with the wire passage channel of the outer jaws and in a second retracted position, the wire tensioning and centering tool is elevationally cleared from the outer jaws, and wherein the wire tensioning and centering tool is laterally movable between a first and second position to maintain an on axis alignment with the outer jaws when said jaws are in the open wire receiving position;

a wire feed system for conveying a wire from a point remote from the end effector to a selected location for acquisition by the end effector, said wire feed system comprising tube means operatively associated with the wire passage bore of the wire tensioning and centering tool, and means operatively associated with said tube means for generating a back air pressure in said tube means to blow the wire from the remote location to the selected location;

stationary clamp means comprising a generally rectangular member which is mounted onto the formboard, said stationary clamp means including a bore therein for receiving a terminated wire therein from said tensioning and centering device and including clamp means in said rectangular member for selectively engaging and releasing said terminated wire within said bore; and at least one alignment fixture adapted to be mounted onto the formboard and defining alignment bore means therein for receiving the terminated wire portion and outer gripper jaws for the alignment of said terminated wire portion with said jaws.

16. The system according to claim 15 wherein the first and second outer jaw means which are slidably mounted with respect to the strut portion of the bracket means include biasing means for maintaining the outer jaws in a neutral position with respect to the strut portion.

17. The system according to claim 16 wherein each strut portion includes at least one bore therein, and the first and second substantially symmetrical outer jaws include at least one rod means slidably disposed in said at least one bore and a collet disposed at each end of said slidably mounted rod, each of said collets defining in part the wire guiding channel.

18. The system according to claim 17 wherein the biasing means are spring means concentrically disposed about the rod means.

19. The system according to claim 18 wherein the strut means has two bores therein, and each of the two outer jaws includes two rod means slidably disposed in the two bores and wherein at least one of the rods has a spring biasing means mounted thereon.

20. The system according to claim 19 wherein each of the collet means includes a pair of knife edge guide means disposed therein.

21. The system according to claim 15 wherein the inner clamp means channels are V-shaped grooves which can accommodate and securely grasp therebetween the wire to be inserted into a connector.

22. The system according to claim 15 wherein the wire tensioning and centering device includes clamp means therein for the selected engaging of a wire disposed in the wire passage bore therethrough.

23. The system according to claim 15 wherein the clamp means includes a pneumatically actuated cylinder.

24. The system according to claim 15 wherein the wire tensioning and centering device is operatively associated with the bracket means by at least one pneumatic cylinder for effecting lateral movement and at least one pneumatic cylinder for effecting elevational displacement.

25. A process for the automated manufacture of a cable harness comprising the steps of:

(1) presenting a terminated wire to a selected end effector;
   (2) loading the terminated wire into the selected end effector;
   (3) positioning the end effector for the insertion of a first end of the terminated wire into a desired first assembly point;
   (4) inserting the first end of the terminated wire into the first assembly point;
   (5) routing the terminated wire along a predetermined cable harness layout;
   (6) loading a second end of the terminated wire into the selected end effector;
   (7) positioning the end effector for insertion of the second end of the terminated wire into a desired second assembly point; and
   (8) inserting the second end of the terminated wire into the desired second assembly point.

26. The process for the automated manufacturing of a cable harness according to claim 25 wherein the step of presenting the terminated wire to a selected end effector includes the step of conveying the terminated wire from a first location distal from the selected end effector to a location proximate to the selected end effector.

27. The process for the automated manufacturing of a cable harness according to claim 25 wherein the step of loading the terminated wire into the selected end effector includes the step of aligning the first end of the terminated wire with the end effector for proper insertion into the first assembly point.

28. The process for the automated manufacturing of a cable harness according to claim 25 wherein the step of routing the terminated wire along a predetermined cable harness layout includes the step of providing a dedicated gripper for conveying the terminated wire from the first assembly point to the second assembly point.

29. The process for the automated manufacturing of a cable harness according to claim 25 wherein the step of inserting the terminated wire into the first assembly point includes the further step of testing the insertion of the wire into the assembly point by insuring that the end of the terminated wire being so inserted is properly mounted in the assembly point.

30. An apparatus for the automated manufacture of a high density cable harness comprising:
- means for presenting a terminated wire to a selected end effector;
- means operatively associated with the presenting means for loading the terminated wire into the selected end effector;
- means operatively associated with the end effector for positioning the end effector for insertion of a first end of the terminated wire into a desired first assembly point;
- means operatively associated with the end effector for inserting the first end of the terminated wire into the first assembly point;
- means operatively associated with the means for positioning the end effector for routing the terminated wire along a predetermined cable harness layout;
- means operatively associated with the end effector for loading a second end of the terminated wire into the selected end effector;
- means operatively associated with the end effector for positioning the end effector for insertion of the second end of the terminated wire into a desired second assembly point; and
- means operatively associated with the end effector for inserting the second end of the terminated wire into a desired second assembly point.

31. An apparatus for the automated manufacture of a cable harness assembly according to claim 30 wherein the means for positioning the end effector for the insertion of a terminated wire into a desired assembly point is an orthogonal robot capable of transporting the selected end effector in the X, Y and Z axes.

32. An apparatus for the automated manufacture of a cable harness assembly according to claim 30 wherein the selected end effector is chosen from a plurality of dedicated end effectors, each of which dedicated end effector is adapted to accommodate a specific style of terminated wire.

* * * * *